US012765145B2

(12) United States Patent
Dong

(10) Patent No.: US 12,765,145 B2
(45) Date of Patent: Oct. 13, 2026

(54) DISPLAY PANEL, PREPARATION METHOD THEREOF, AND DISPLAY APPARATUS

(71) Applicant: Wuhan Tianma Microelectronics Co., Ltd., Wuhan (CN)

(72) Inventor: Bo Dong, Wuhan (CN)

(73) Assignee: Wuhan Tianma Microelectronics Co., Ltd., Wuhan (CN)

(*) Notice: Subject to any disclaimer, the term of this patent is extended or adjusted under 35 U.S.C. 154(b) by 386 days.

(21) Appl. No.: 18/381,457

(22) Filed: Oct. 18, 2023

(65) Prior Publication Data

US 2024/0055573 A1 Feb. 15, 2024

(30) Foreign Application Priority Data

Mar. 30, 2023 (CN) ......................... 202310350251.1

(51) Int. Cl.

*H01L 21/68* (2006.01)
*H10H 20/857* (2025.01)
*H10W 90/00* (2026.01)
*H10H 20/01* (2025.01)

(52) U.S. Cl.

CPC .......... *H10H 20/857* (2025.01); *H10W 90/00* (2026.01); *H10H 20/0364* (2025.01)

(58) Field of Classification Search

CPC ............. H10H 20/857; H10H 20/0364; H10H 29/142; H01L 25/0753; H01L 25/167; H10K 59/131; G09G 2300/0426
USPC ............................................................ 257/79
See application file for complete search history.

(56) References Cited

U.S. PATENT DOCUMENTS

| | | | | |
|---|---|---|---|---|
| 9,786,229 | B2 * | 10/2017 | Lee | G09G 3/3275 |
| 10,634,499 | B2 * | 4/2020 | Ayazi | G01P 15/097 |
| 11,309,216 | B2 * | 4/2022 | Reznicek | H10N 50/01 |
| 11,587,507 | B2 * | 2/2023 | Lee | G09G 3/3275 |
| 11,711,956 | B2 * | 7/2023 | Du | G02F 1/133 345/206 |
| 12,144,218 | B2 * | 11/2024 | Han | G09F 9/30 |
| 12,245,461 | B2 * | 3/2025 | Hong | H10K 59/131 |
| 12,259,623 | B2 * | 3/2025 | Huo | G02F 1/136204 |
| 12,412,835 | B2 * | 9/2025 | Sharma | H01L 23/522 |

(Continued)

FOREIGN PATENT DOCUMENTS

| | | | |
|---|---|---|---|
| CN | 105702685 | A | 6/2016 |
| CN | 107564921 | A | 1/2018 |

(Continued)

*Primary Examiner* — Vu A Vu
(74) *Attorney, Agent, or Firm* — KDW Firm PLLC

(57) ABSTRACT

Provided are a display panel, a preparation method thereof, and a display apparatus. The display panel includes a display region and a fan-out wire region. The display region includes multiple data lines. The fan-out wire region includes multiple fan-out wires. A fan-out wire of the multiple fan-out wires is electrically connected to a respective data line of the multiple data lines. The fan-out wires include multiple first fan-out wires and multiple second fan-out wires. A second fan-out wire is located on a side of a first fan-out wire facing away from a substrate. The first fan-out wire includes a first main portion and a first edge portion. The second fan-out wire includes a second main portion and a second edge portion. At least one first main portion does not overlap at least one second main portion.

20 Claims, 10 Drawing Sheets

(56) References Cited

U.S. PATENT DOCUMENTS

| | | | | |
|---|---|---|---|---|
| 2024/0006560 | A1* | 1/2024 | Tsai | H10H 20/8312 |
| 2024/0162185 | A1* | 5/2024 | Huang | H01L 24/16 |
| 2024/0292719 | A1* | 8/2024 | Han | H10K 59/879 |
| 2024/0431163 | A1* | 12/2024 | He | H10K 59/1201 |

FOREIGN PATENT DOCUMENTS

| | | | |
|---|---|---|---|
| CN | 216015363 | U | 3/2022 |
| CN | 114597222 | A | 6/2022 |

* cited by examiner

DISPLAY PANEL, PREPARATION METHOD THEREOF, AND DISPLAY APPARATUS

CROSS-REFERENCE TO RELATED APPLICATION

This application claims priority to Chinese patent application No. 202310350251.1 filed with the CNIPA on Mar. 30, 2023, the disclosure of which is incorporated herein by reference in its entirety.

TECHNICAL FIELD

The present disclosure relates to the field of display technology and, in particular, to a display panel, a preparation method thereof, and a display apparatus.

BACKGROUND

The display resolution in an existing display product is increasingly higher. Correspondingly, more and more display signal lines are connected to light-emitting elements. The display signal lines occupy an increasingly larger space in a lower bezel position of the display product, which is inconsistent with the development trend of a narrow bezel of the display product.

SUMMARY

The present disclosure provides a display panel, a preparation method thereof, and a display apparatus so as to solve the problem of a narrow bezel of the display panel, reduce the interference between different signal lines, and guarantee the display effect.

An embodiment of the present disclosure provides a display panel. The display panel includes a display region and a fan-out wire region.

The display region includes multiple data lines. The fan-out wire region includes multiple fan-out wires. A fan-out wire of the multiple fan-out wires is electrically connected to a respective data line of the multiple data lines.

The multiple fan-out wires include multiple first fan-out wires and multiple second fan-out wires. The display panel further includes a substrate. A second fan-out wire of the multiple second fan-out wires is located on a side of a first fan-out wire of the multiple first fan-out wires facing away from the substrate.

The first fan-out wire includes a first main portion and a first edge portion. The first edge portion is located at an edge of the first main portion. A thickness of the first edge portion is less than a thickness of the first main portion. The second fan-out wire includes a second main portion and a second edge portion. The second edge portion is located at an edge of the second main portion. A thickness of the second edge portion is less than a thickness of the second main portion.

In a thickness direction of the display panel, at least one first main portion of first main portions of the multiple first fan-out wires does not overlap at least one second main portion of second main portions of the multiple second fan-out wires.

An embodiment of the present disclosure further provides a preparation method of a display panel. The preparation method is used for preparing the display panel described in the preceding embodiment. The preparation method includes the steps below.

A substrate is provided.

A first fan-out wire is prepared on a side of the substrate. The first fan-out wire includes a first main portion and a first edge portion. The first edge portion is located at an edge of the first main portion. A thickness of the first edge portion is less than a thickness of the first main portion.

A second fan-out wire is prepared on a side of the first fan-out wire facing away from the substrate. The second fan-out wire includes a second main portion and a second edge portion. The second edge portion is located at an edge of the second main portion. The thickness of the second edge portion is less than the thickness of the second main portion. At least one first main portion does not overlap at least one second main portion in a thickness direction of the display panel.

An embodiment of the present disclosure further provides a display apparatus. The display apparatus includes the display panel described in the preceding embodiment.

For the display panel in embodiments of the present disclosure, the fan-out wires include multiple first fan-out wires and multiple second fan-out wires. A second fan-out wire is located on a side of a first fan-out wire facing away from the substrate. That is, the fan-out wires include the first fan-out wires and the second fan-out wires, with the first fan-out wires in a different layer from the second fan-out wires, thereby reducing the space occupied by the fan-out wires in a bezel region, reducing the lower bezel of the display panel, and helping implement the display panel designed with a narrow bezel. Further, the first main portion of the first fan-out wire does not overlap the second main portion of the second fan-out wire, preventing a parasitic capacitance from being generated between the first main portion and the second main portion, guaranteeing that display signals transmitted in the first fan-out wire and the second fan-out wire are subject to little interference, and guaranteeing the display effect. Moreover, a layer above the fan-out wires does not have poor coverage due to the overlapping and protrusion of main portions, guaranteeing the structural stability of the display panel.

It is to be understood that the content described in this section is neither intended to identify key or critical features of embodiments of the present disclosure nor intended to limit the scope of the present disclosure. Other features of the present disclosure become easily understood through the description hereinafter.

BRIEF DESCRIPTION OF DRAWINGS

To illustrate the technical solutions in embodiments of the present disclosure more clearly, drawings used in the description of the embodiments are briefly described below. Apparently, the drawings described below only illustrate part of embodiments of the present disclosure, and those of ordinary skill in the art may obtain other drawings based on the drawings on the premise that no creative work is done.

DETAILED DESCRIPTION

Technical solutions in embodiments of the present disclosure are described clearly and completely in conjunction with drawings in embodiments of the present disclosure from which technical solutions of the present disclosure are better understood by those skilled in the art. Apparently, the embodiments described below are part, not all, of embodiments of the present disclosure. Based on embodiments of the present disclosure, all other embodiments obtained by those of ordinary skill in the art on the premise that no creative work is done are within the scope of the present disclosure.

It is to be noted that terms such as "first" and "second" in the description, claims and drawings of the present disclosure are used for distinguishing between similar objects and are not necessarily used for describing a particular order or sequence. It is to be understood that the data used in this manner are interchangeable in appropriate cases so that embodiments of the present disclosure described herein can be implemented in an order not illustrated or described herein. Additionally, the terms "including", "having" and variations thereof are intended to encompass a non-exclusive inclusion. For example, a process, method, system, product, or device that includes a series of steps or units not only includes the expressly listed steps or units but may also include other steps or units that are not expressly listed or are inherent to such process, method, product, or device.

Figure 1:
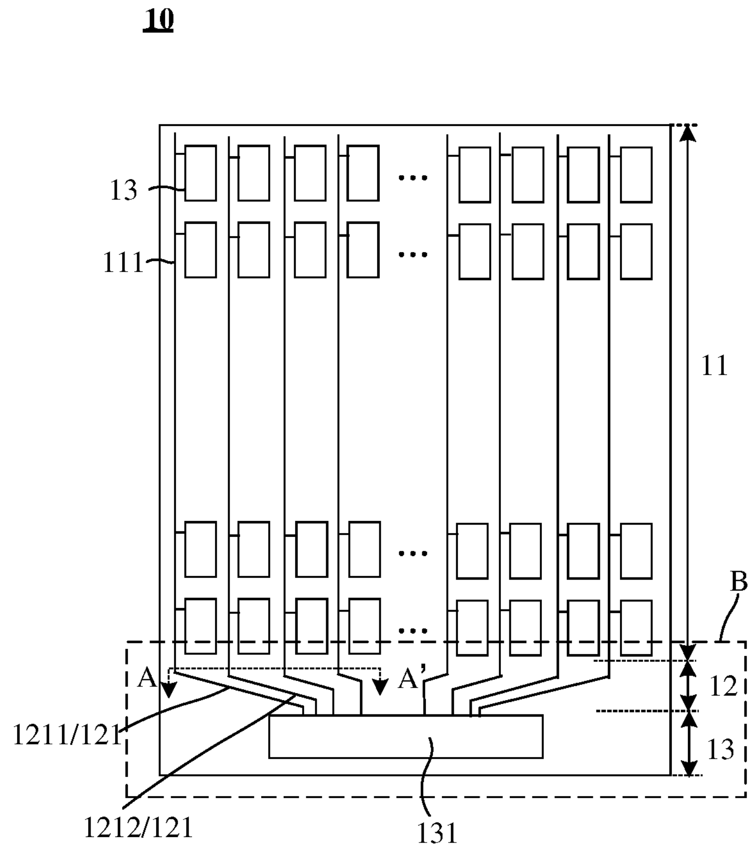
FIG. 1 is a structural diagram of a display panel according to an embodiment of the present disclosure.
Figure 2:
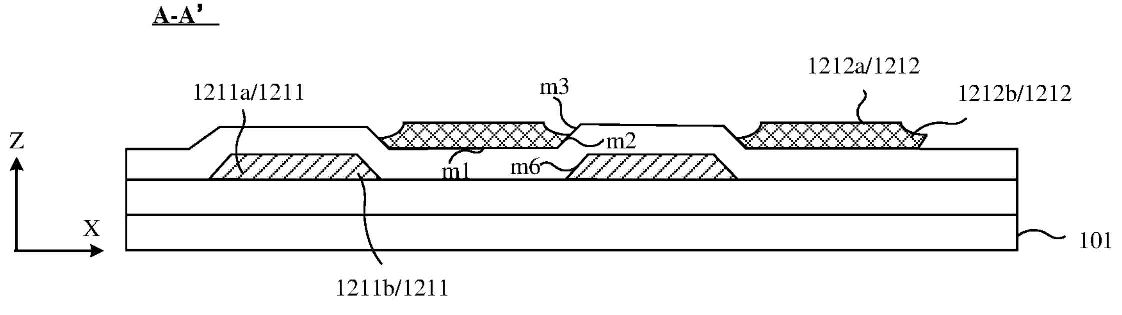
FIG. 2 is a sectional view of the display panel shown in FIG. 1 taken along section line A-A'.

FIG. 1 is a structural diagram of a display panel according to an embodiment of the present disclosure. FIG. 2 is a sectional view of the display panel shown in FIG. 1 taken along section line A-A'. Referring to FIGS. 1 and 2, the display panel 10 according to the embodiment of the present disclosure includes a display region 11 and a fan-out wire region 12. The display region 11 includes multiple data lines 111. The fan-out wire region 12 includes multiple fan-out wires 121. A fan-out wire 121 is electrically connected to a respective data line 111. The fan-out wires 121 include multiple first fan-out wires 1211 and multiple second fan-out wires 1212. The display panel 10 further includes a substrate 101. A second fan-out wire 1212 is located on a side of a first fan-out wire 1211 facing away from the substrate 101. The first fan-out wire 1211 includes a first main portion **1211*a* and a first edge portion 1211*b*. The first edge portion 1211*b* is located at an edge of the first main portion 1211*a*. The thickness of the first edge portion 1211*b* is less than the thickness of the first main portion 1211*a*. The second fan-out wire 1212 includes a second main portion 1212*a* and a second edge portion 1212*b*. The second edge portion 1212*b* is located at an edge of the second main portion 1212*a*. The thickness of the second edge portion 1212*b* is less than the thickness of the second main portion 1212*a*. In a thickness direction of the display panel (for example, direction Z shown in FIG. 2) of the display panel, at least one first main portion 1211*a* of first main portions 1211*a* of the multiple first fan-out wires 1211 does not overlap at least one second main portion 1212*a* of second main portions 1212*a*** of the multiple second fan-out wires.

In an exemplary embodiment, the display panel 100 includes the display region 11 and the fan-out wire region 12. The display region 11 is provided with sub-pixels 13 and data lines 111 connected to each column of sub-pixels 13. The data lines 111 are used for supplying data signals to the sub-pixels 13 so that the sub-pixels 13 perform light emission and display according to the data signals. In an example, the sub-pixels 13 may include light-emitting elements and pixel circuits (not shown). A light-emitting element may be, for example, an organic light-emitting diode (OLED), a mini light-emitting diode (LED), a micro LED, or a quantum dot light-emitting diode (QLED). The specific type of a light-emitting element is not limited in the embodiment of the present disclosure. In an example, the light-emitting elements may include red light-emitting elements, green light-emitting elements, and blue light-emitting elements. Light-emitting elements of different colors may have different arrangement manners, for example, a diamond pixel arrangement, a standard Red-Green-Blue (RGB) arrangement, a delta pixel arrangement, a pearl pixel arrangement, or a 2-in-1 pixel arrangement. Specific arrangement manners of light-emitting elements of different colors are not limited in the embodiment of the present disclosure. In an example, a pixel circuit may include a thin-film transistor and a capacitor. Moreover, the number of thin-film transistors and the number of capacitors may be set by those skilled in the art according to actual requirements. For example, a pixel circuit may be a 2T1C circuit, a 7T1C circuit, or a 7T2C circuit. A 2T1C circuit refers to a pixel circuit including two thin-film transistors (T) and one capacitor (C). A 7T1C circuit and a 7T2C circuit can be understood in the same way. Additionally, the display region 10 further includes a non-display region. The non-display region is at least located on a side of the display region 11. Taking FIG. 1 for example, the non-display region is located below the display region 11. The non-display region may include the fan-out wire region 12 and a bonding region 13. The fan-out wire region 12 is provided with the fan-out wires 121. The bonding region 13 is provided with a driver chip 131. A fan-out wire 121 is electrically connected to a data line 111 and the driver chip 131 and is used for transmitting a data signal output by the driver chip 131 to the data line 111.

As the display resolution in the display panel improves gradually, the number of sub-pixel columns included in the display region 11 increases gradually, more data lines 111 and fan-out wires 121 are required to cooperate to implement a high resolution. The increase of the fan-out wires 121 inevitably occupies more area in a lower bezel position, which is inconsistent with the development trend of a narrow bezel of the display panel. Therefore, in the embodiment of the present disclosure, the fan-out wires 121 may include the first fan-out wires 1211 and the second fan-out wires 1212, with the first fan-out wires 1211 in a different layer from the second fan-out wires 1212. The arrangement in which the fan-out wires 121 are disposed in two different layers reduces the area of the lower bezel occupied by the fan-out wires, reduces the area of the lower bezel, and improves the display screen ratio of the display panel. In an exemplary embodiment, the fan-out wires 121 include the first fan-out wires 1211 and the second fan-out wires 1212. A first fan-out wire 1211 is located on a side facing the substrate 101. A second fan-out wire 1212 is located on a side of the first fan-out wire 1211 facing away from the substrate 101. The first fan-out wires 1211 are disposed in a different layer from the second fan-out wires 1212. Therefore, compared with two fan-out wires disposed in the same layer, a gap between the first fan-out wire 1211 and the second fan-out wire 1212 may be adjusted to reduce the space occupied by the fan-out wires, achieving an object of reducing the area of the lower bezel. In an example, the first fan-out wires 1211 and the second fan-out wires 1212 that are located in different layers may be alternated in sequence. That is, any two adjacent data lines 111 are electrically connected to a first fan-out wire 1211 and a second fan-out wire 1212, respectively. That is, two adjacent data lines 111 are electrically connected to fan-out wires 121 in different layers, respectively. Such an arrangement can reduce the signal interference between two adjacent data lines 111 and guarantee the display effect.

In an exemplary embodiment, with continued reference to FIG. 2, the first fan-out wire 1211 includes the first main portion 1211*a* and the first edge portion 1211*b*. The first main portion 1211*a* may be understood as a main structure of the first fan-out wire 1211. Signals are more transmitted in the first main portion 1211*a*. The first edge portion 1211*b* may be understood as a non-main structure of the first fan-out wire 1211, for example, an edge portion caused by a process. In an example, the first main portion 1211*a* and the first edge portion 1211*b* may be divided based on arrangement positions. For example, the first edge portion 1211*b* is located at an edge of the first main portion 1211*a*. Alternatively, the first main portion 1211*a* and the first edge portion 1211*b* may be divided based on layer thicknesses. The thickness of the first edge portion 1211*b* is less than the thickness of the first main portion 1211*a*. In an example, the second fan-out wire 1212 includes the second main portion 1212*a* and the second edge portion 1212*b*. The second main portion 1212*a* may be understood as a main structure of the second fan-out wire 1212. Signals are more transmitted in the second main portion 1212*a*. The second edge portion 1212*b* may be understood as a non-main structure of the second fan-out wire 1212, for example, an edge portion caused by a process. In an example, the second main portion 1212*a* and the second edge portion 1212*b* may be divided based on arrangement positions. For example, the second edge portion 1212*b* is located at an edge of the second main portion 1212*a*. Alternatively, the second main portion 1212*a* and the second edge portion 1212*b* may be divided based on layer thicknesses. The thickness of the second edge portion 1212*b* is less than the thickness of the second main portion 1212*a*.

Moreover, in the thickness direction (for example, direction Z shown in FIG. 2) of the display panel, at least one first main portion 1211*a* does not overlap at least one second main portion 1212*a*, preventing a parasitic capacitance from being generated between the first main portion 1211*a* and the second main portion 1212*a*, guaranteeing that display signals transmitted in the first fan-out wire 1211 and the second fan-out wire 1212 are subject to little interference, and guaranteeing the display effect. Moreover, a layer above the fan-out wires does not have poor coverage due to the overlapping and protrusion of the main portions, guaranteeing the flatness of the layer above the fan-out wires and further guaranteeing the structural stability of the display panel.

Above all, for technical solutions in the embodiment of the present disclosure, the fan-out wires include the first fan-out wires and the second fan-out wires, with the first fan-out wires in a different layer from the second fan-out wires. A small distance exists between a first fan-out wire and a second fan-out wire that are in different layers, thereby reducing the space occupied by the fan-out wires in a bezel region, reducing the lower bezel of the display panel, and helping implement the display panel designed with a narrow bezel. Further, the first main portion of the first fan-out wire does not overlap the second main portion of the second fan-out wire, preventing a parasitic capacitance from being generated between the first main portion and the second main portion, guaranteeing that display signals transmitted in the first fan-out wire and the second fan-out wire are subject to little interference, and guaranteeing the display effect. Moreover, a layer above the fan-out wires does not have poor coverage due to the overlapping and protrusion of the main portions, guaranteeing the structural stability of the display panel.

Figure 3:
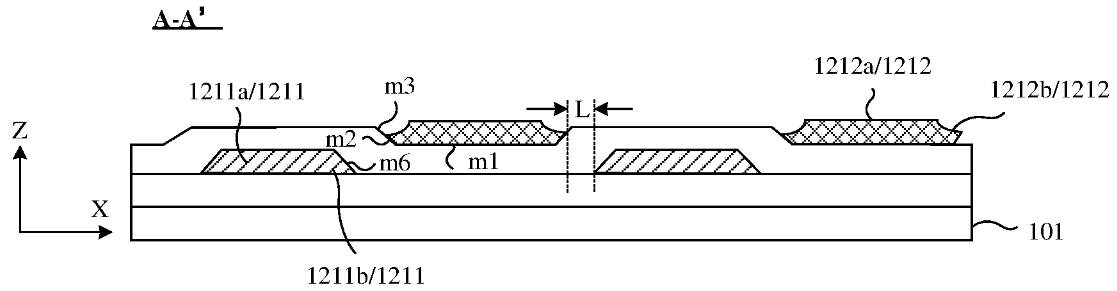
FIG. 3 is another sectional view of the display panel shown in FIG. 1 taken along section line A-A'.

On the basis of the preceding embodiments, FIG. 3 is another sectional view of the display panel shown in FIG. 1 taken along section line A-A'. Referring to FIGS. 1, 2, and 3, in the thickness direction of the display panel, the first edge portion 1211*b* partially overlaps the second edge portion 1212*b*. Alternatively, in the thickness direction of the display panel, the first edge portion 1211*b* does not overlap the second edge portion 1212*b*; and in a first direction, the minimum distance L between the first edge portion 1211*b* and the second edge portion 1212*b* satisfies that $L \leq 0.3$ μm. The first direction is an arrangement direction of the fan-out wires.

In an exemplary embodiment, as shown in FIG. 2, in the thickness direction of the display panel, for example, direction Z shown in the figure, the first edge portion 1211*b* partially overlaps the second edge portion 1212*b*. In this case, a portion where the first edge portion 1211*b* overlaps the second edge portion 1212*b* is an end portion of an edge, that is, a portion with a relatively small thickness. The overlapping area between the first edge portion 1211*b* and the second edge portion 1212*b* is relatively small. The thickness of the first edge portion 1211*b* and the thickness of the second edge portion 1212*b* are relatively small. Therefore, in a layer above the fan-out wires 121, no protrusion is formed in the region where the first edge portion 1211*b* overlaps the second edge portion 1212*b*, guaranteeing that the layer above the fan-out wires has a relatively sound flatness.

As shown in FIG. 3, in the thickness direction of the display panel, the first edge portion 1211*b* does not overlap the second edge portion 1212*b*. In this case, the orthographic projection of the first edge portion 1211*b* on a plane where the substrate 101 is located is in contact with or is not in contact with the orthographic projection of the second edge portion 1212*b* on the plane where the substrate 101 is located. When the orthographic projection of the first edge portion 1211*b* on the plane where the substrate 101 is located is in contact with the orthographic projection of the second edge portion 1212*b* on the plane where the substrate 101 is located, in the layer above the fan-out wires 121, no pit is formed at the spacing between the first edge portion 1211*b* and the second edge portion 1212*b*, guaranteeing that the layer above the fan-out wires has a relatively sound flatness. When the orthographic projection of the first edge portion 1211*b* on the plane where the substrate 101 is located is not in contact with the orthographic projection of the second edge portion 1212*b* on the plane where the substrate 101 is located, the distance between the first edge portion 1211*b* and the second edge portion 1212*b* is small. For example, in the arrangement direction of the fan-out wires 121, for example, direction X shown in the figure, the minimum distance L between the first edge portion 1211*b* and the second edge portion 1212*b* satisfies that $L \leq 0.3$ μm. In this case, in the layer above the fan-out wires 121, no pit is formed at the spacing between the first edge portion 1211*b* and the second edge portion 1212*b*, guaranteeing that the layer above the fan-out wires has a relatively sound flatness.

On the basis of the preceding embodiments, with continued reference to FIGS. 2 and 3, the thickness of the second edge portion 1212*b* increases gradually in a direction of the second edge portion 1212*b* pointing to the second main portion 1212*a*.

Exemplarily, the thickness of the second edge portion 1212*b* increases gradually in the direction of the second edge portion 1212*b* pointing to the second main portion 1212*a*, for example, direction X shown in FIGS. 2 and 3. That is, in the second edge portion 1212*b*, a position closer to the second main portion 1212*a* has a greater thickness, and a position farther away from the second main portion 1212*a* has a less thickness. On one hand, the structure of the second edge portion 1212*b* matches the preparation process of the second edge portion 1212*b*, guaranteeing that the preparation process of the second edge portion 1212*b* is simple. On the other hand, when the second edge portion 1212*b* overlaps the first edge portion 1211*b*, a relatively large protrusion may be prevented from existing in an overlapping position of the second edge portion 1212*b* and the first edge portion 1211*b* because an edge of the second edge portion 1212*b* has a relatively small thickness. In the layer above the fan-out wires 121, no protrusion is formed in the region where the first edge portion 1211*b* overlaps the second edge portion 1212*b*, guaranteeing that the layer above the fan-out wires has a relatively sound flatness.

On the basis of the preceding embodiments, with continued reference to FIGS. 2 and 3, the second main portion 1212*a* includes a first surface m1 on a side of the second main portion 1212*a* facing the substrate 101. The second edge portion 1212*b* includes a second surface m2 on a side of the second edge portion 1212*b* facing the substrate 101. A plane where the first surface m1 is located is parallel to the plane where the substrate 101 is located. A plane where the second surface m2 is located intersects the plane where the substrate 101 is located.

Exemplarily, the second main portion 1212*a* includes the first surface m1 on a side of the second main portion 1212*a* facing the substrate 101. The plane where the first surface m1 is located is parallel to the plane where the substrate 101 is located. For example, the plane where the first surface m1 is located and the plane where the substrate 101 is located are each a horizontal panel. In this case, the second main portion 1212*a* has a sound flatness entirely, guaranteeing the normal transmission of a display signal.

The second edge portion 1212*b* includes the second surface m2 on a side of second edge portion 1212*b* facing the substrate 101. The plane where the second surface m2 is located intersects the plane where the substrate 101 is located. For example, when the plane where the substrate 101 is located is a horizontal panel, the plane where the second surface m2 is located is an inclined plane. An insulating layer exists between the first fan-out wire 1211 and the second fan-out wire 1212. The first fan-out wire 1211 is disposed below the insulating layer. Therefore, a slope exists between an arrangement region of the first fan-out wire 1211 and a non-arrangement region of the first fan-out wire 1211, such as m3 in the figure. In this case, the second surface m2 may be parallel to the slope m3. For example, the second surface m2 is in contact with the slope m3; that is, the second edge portion 1212*b* of the second fan-out wire 1212 includes a portion extending along the slope m3. Such an arrangement can guarantee a relatively small distance between the second edge portion 1212*b* and the first edge portion 1211*b*. On one hand, it guarantees that more fan-out wires can be disposed in a limited space, helping implement the high display resolution of the display panel. On the other hand, in the layer above the fan-out wires 121, no recess is formed at the spacing between the first edge portion 1211*b* and the second edge portion 1212*b*, guaranteeing that the layer above the fan-out wires has a relatively sound flatness.

On the basis of the preceding embodiments, with continued reference to FIGS. 2 and 3, the second main portion 1212*a* includes a third surface m4 on a side of the second main portion 1212*a* facing away from the substrate 101. A plane where the third surface m4 is located is parallel to the plane 101 where the substrate is located. The second edge portion 1212*b* includes the second surface m2 on a side of the second edge portion 1212*b* facing the substrate 101 and a first side surface m5 connecting the second surface m2 and the third surface m4. The first side surface m5 includes a curved surface.

Exemplarily, the second main portion 1212*a* includes the third surface m4 on a side of the second main portion 1212*a* facing away from the substrate 101. A plane where the third surface m4 is located is parallel to the plane where the substrate 101 is located. For example, the plane where the third surface m4 is located and the plane where the substrate 101 is located are each a horizontal panel. In this case, the second main portion 1212*a* has a sound flatness entirely, guaranteeing the normal transmission of a display signal.

The second edge portion 1212*b* includes the second surface m2 on a side of the second edge portion 1212*b* facing the substrate 101 and the first side surface m5 connecting the second surface m2 and the third surface m4. The first side surface m5 includes a curved surface. The shape of the first side surface m5 is related to the forming process of the second edge portion 1212*b*. In an exemplary embodiment, the second fan-out wire 1212 may be formed through a secondary etching process. For example, the second main portion 1212*a* and the second edge portion 1212*b* are formed in different etching processes. The second edge portion 1212*b* may be prepared and obtained through an optical proximity correction (OPC) process. In an example, the OPC process may be understood as using a mask with a special shape to form a thick photoresist region, a thin photoresist region and a non-photoresist region in the photoresist above the preparation layer of the second fan-out wire. The thick photoresist region may correspond to the second main portion 1212*a*. The thin photoresist region may correspond to the second edge portion 1212*b*. The OPC process is described in detail in subsequent embodiments. The OPC process guarantees that the distance between the second fan-out wire 1212 and the first fan-out wire 1211 is not excessively large to form a recess in the layer above the fan-out wires and that the distance between the second fan-out wire 1212 and the first fan-out wire 1211 is not excessively small to form a protrusion in the layer above the fan-out wires, thereby guaranteeing the flatness of the layer above the fan-out wires and guaranteeing the stable structure of the display panel.

Figure 4:
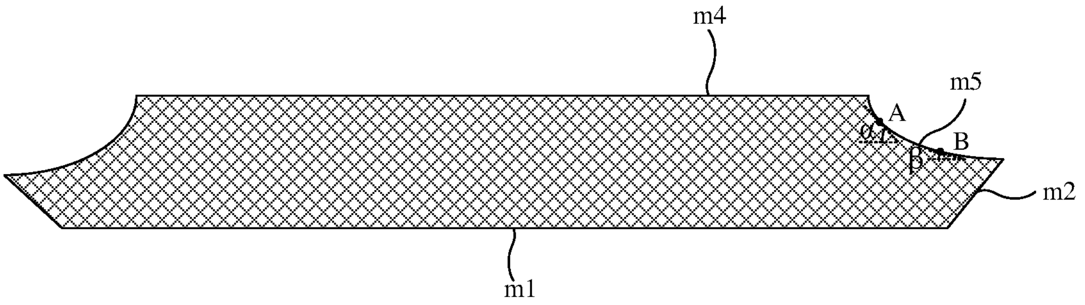
FIG. 4 is a structural diagram of a second fan-out wire according to an embodiment of the present disclosure.

In an exemplary embodiment, FIG. 4 is a structural diagram of a second fan-out wire according to an embodiment of the present disclosure. As shown in FIG. 4, the first side surface m5 has two positions. An included angle between a tangent plane of a position closer to the second main portion 1212*a* and the plane where the substrate 101 is located is greater than an included angle between a tangent plane of a position farther away from the second main portion 1212*a* and the plane where the substrate 101 is located. In an example, the first side surface m5 has two positions, for example, position A and position B in the figure. Position A is located on a side of position B facing the second main portion 1212*a*. Moreover, the included angle between the tangent plane of position A and the plane where the substrate 101 is located is a, and the included angle between the tangent plane of position B and the plane where the substrate 101 is located is β, where α>β. That is, in the first side surface m5, the included angle between the tangent plane of the position facing the second main portion 1212*a* and the plane where the substrate 101 is located is greater than the included angle between the tangent plane of the position facing away from the second main portion 1212*a* and the plane where the substrate 101 is located. In other words, in the second edge portion 1212*b*, the height of the second edge portion 1212*b* on a side facing the second main portion 1212*a* has a larger change rate, and the height of the second edge portion 1212*b* on a side facing away from the second main portion 1212*a* has a smaller change rate. That is, in the second edge portion 1212*b*, the part on a side facing the second main portion 1212*a* is steeper, and the part on a side facing away from the second main portion 1212*a* is gentler. Such an arrangement can guarantee that the part in the second edge portion 1212*b* on a side facing away from the second main portion 1212*a* has a smaller thickness and a smoother height change. That is, the part in the second edge portion 1212*b* on a side facing away from the second main portion 1212*a* has a relatively small thickness entirely. In this case, even if the first fan-out wire 1211 overlaps the second fan-out wire 1212 at the second edge portion 1212*b*, no relatively large protrusion is formed in an overlapping position of the first fan-out wire 1211 and the second fan-out wire 1212 because the entire thickness of the second edge portion 1212*b* is relatively small, guaranteeing the flatness of the layer above the fan-out wires and guaranteeing the stable structure of the display panel.

With continued reference to FIGS. 2 and 3, as an exemplary embodiment, the first edge portion 1211*b* includes a second side surface m6. The second edge portion 1212*b* includes the second surface m2 on a side facing the substrate 101. A plane where the second side surface m6 is located is parallel to a plane where the second surface m2 is located.

In an exemplary embodiment, the first edge portion 1211*b* includes the second side surface m6. The second edge portion 1212*b* includes the second surface m2 on a side facing the substrate 101. The plane where the second side surface m6 is located is parallel to the plane where the second surface m2 is located. That is, the second side surface m6 and the second surface m2 have the same inclination degree. Such an arrangement can guarantee a relatively small distance between the second side surface m6 and the second surface m2, further guaranteeing a relatively small distance between the second edge portion 1212*b* and the first edge portion 1211*b*. On one hand, it may guarantee that more fan-out wires are disposed in a limited space, helping implement the high display resolution of the display panel. On the other hand, in the layer above the fan-out wires 121, no recess is formed at the spacing between the first edge portion 1211*b* and the second edge portion 1212*b*, guaranteeing that the layer above the fan-out wires has a relatively sound flatness.

With continued reference to FIGS. 2 and 3, as an exemplary embodiment, in the first direction (for example, direction X shown in the figures), the width of the second fan-out wire 1212 is greater than the width of the first fan-out wire 1211. The first direction is an arrangement direction of the fan-out wires.

In an exemplary embodiment, the second fan-out wire 1212 may be formed through a secondary etching process. For example, the second main portion 1212*a* and the second edge portion 1212*b* are formed in different etching processes. The second fan-out wire 1212 may be prepared and obtained through the OPC process. In an example, the OPC process may be understood as using a mask with a special shape to form a thick photoresist region, a thin photoresist region and a non-photoresist region in the photoresist above the preparation layer of the second fan-out wire. The thick photoresist region may correspond to the second main portion 1212*a*. The thin photoresist region may correspond to the second edge portion 1212*b*. The second fan-out wire 1212 is obtained by using the OPC process for secondary etching. The first fan-out wire 1211 is obtained through a primary etching process. Therefore, the etching accuracy of the second fan-out wire 1212 is greater than the etching accuracy of the first fan-out wire 1211, guaranteeing relatively small etching losses of the second fan-out wire 1212 in the etching process and guaranteeing a relatively large remaining part of the second fan-out wire 1212 after the secondary etching process is finished. That is, in the arrangement direction of the fan-out wires, the width of the second fan-out wire 1212 is greater than the width of the first fan-out wire 1211. Since the width of the second fan-out wire 1212 is greater than the width of the first fan-out wire 1211, the resistance of the second fan-out wire 1212 is less than the resistance of the first fan-out wire 1211. In this case, display signals transmitted on the second fan-out wire 1212 have small losses, guaranteeing a sound display effect of the display panel.

Figure 5:
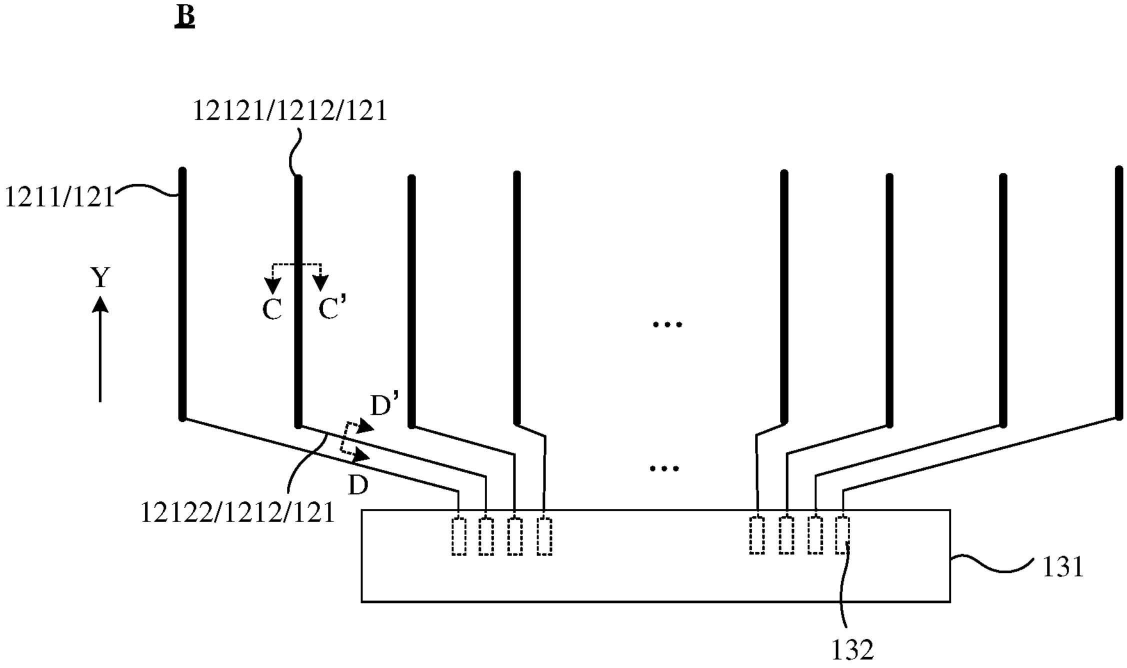
FIG. 5 is an enlarged view of region B of the display panel shown in FIG. 1.

In an exemplary embodiment, FIG. 5 is an enlarged view of region B of the display panel shown in FIG. 1. Referring to FIGS. 1 and 5, the display panel 10 further includes the bonding region 131. The bonding region 131 is located on a side of the fan-out wire region 12 facing away from the display region 11. The bonding region 131 includes a bonding pad 132. The second fan-out wire 1212 includes a first wire segment 12121 and a second wire segment 12122 that are connected to each other. The first wire segment 12121 is electrically connected to a data line 111. The second wire segment 12122 is electrically connected to the bonding pad 132. An included angle between the first wire segment 12121 and a preset direction is less than an included angle between the second wire segment 12122 and the preset direction. The preset direction is parallel to a direction of the display region 11 pointing to the bonding region 131. The wire width of the first wire segment 12121 is greater than the wire width of the second wire segment 12122.

In an example, referring to FIGS. 1 and 5, the second fan-out wire 1212 includes the first wire segment 12121 and the second wire segment 12122 that are connected to each other. The first wire segment 12121 may be understood as a part in the second fan-out wire 1212 and connected to the data line 111. The second wire segment 12122 may be understood as a part in the second fan-out wire 1212 and connected to the bonding pad 131. The first wire segment 12121 and the second wire segment 12122 are connected to each other to transmit a display signal output by the bonding pad 121 to the data line 111. Moreover, the first wire segment 12121 and the second wire segment 12122 have different extension directions. In an example, the included angle between the first wire segment 12121 and the preset direction (for example, direction Y shown in the figure) is relatively small. The included angle between the second wire segment 12122 and the preset direction (for example, direction Y shown in the figure) is relatively large. For example, the included angle between the first wire segment 12121 and the preset direction is 0°. The included angle between the second wire segment 12122 and the preset direction is 30°, 45°, 60°, or 79°. Since the included angle between the first wire segment 12121 and the preset direction is less than the included angle between the second wire segment 12122 and the preset direction, the arrangement space of the first wire segment 12121 is smaller than the arrangement space of the second wire segment 12122. In order to guarantee that a sufficient number of second wire segments may be disposed in arrangement regions of the second wire segments 12122 to meet the requirements of the display resolution of the display panel, the wire width of the first wire segment 12121 may be set greater than the wire width of the second wire segment 12122. On one hand, such an arrangement guarantees that the second wire segments 12122 may be normally disposed in the arrangement region of the second wire segments 12122; on the other hand, this arrangement can also guarantee the resistance of the first wire segment 12121 with a relatively great wire width is less than the resistance of the second wire segment 12122 with a relatively small wire width, reducing losses of a display signal in the transmission process and guaranteeing the display effect of the display panel.

It is to be noted that the display panel according to the embodiment of the present disclosure further includes the driver chip 131 located in the bonding region 13. The driver chip 131 is electrically connected to the bonding pad 132 and covers the driver chip 132. Therefore, the bonding pad 132 is shown in dotted lines in the figures.

Figure 6:
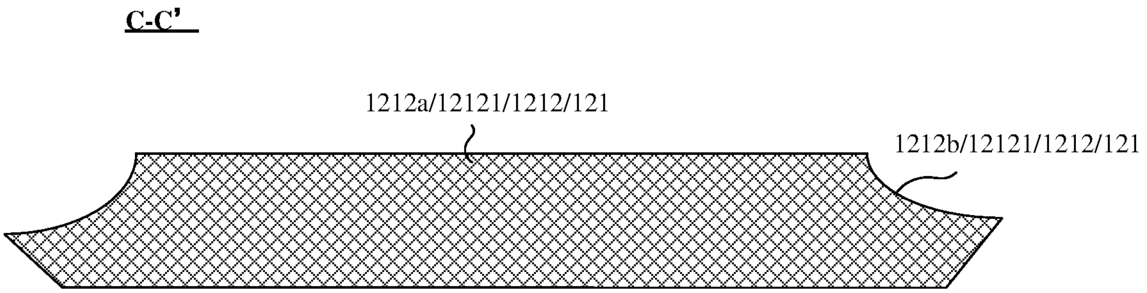
FIG. 6 is a sectional view illustrating a structure of the enlarged view of region B shown in FIG. 5 taken along section line C-C'.
Figure 7:
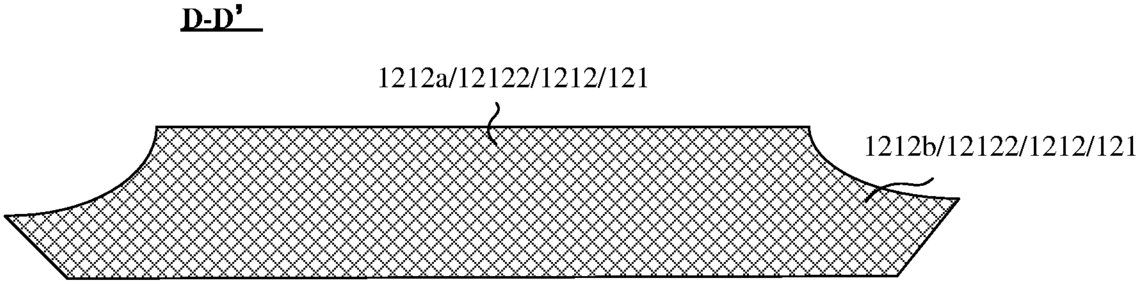
FIG. 7 is a sectional view illustrating a structure of the enlarged view of region B shown in FIG. 5 taken along section line D-D'.
Figure 8:
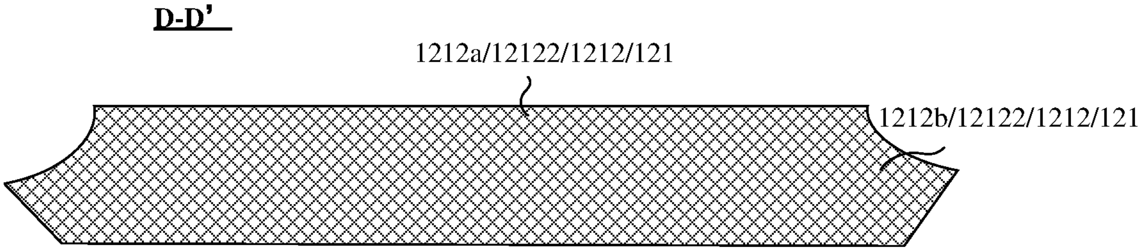
FIG. 8 is a sectional view illustrating another structure of the enlarged view of region B shown in FIG. 5 taken along section line D-D'.
Figure 9:
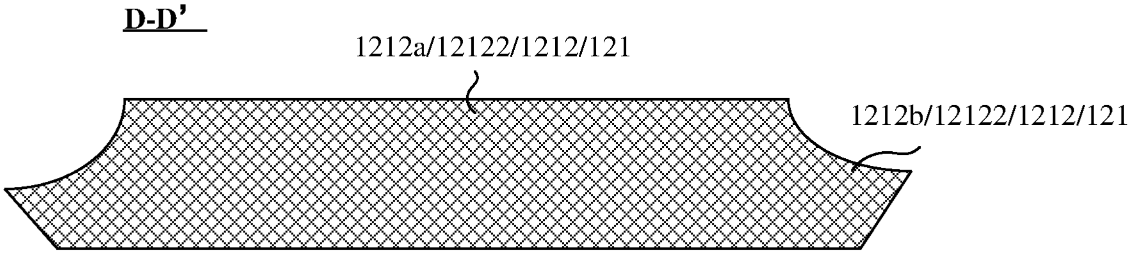
FIG. 9 is a sectional view illustrating another structure of the enlarged view of region B shown in FIG. 5 taken along section line D-D'.

On the basis of the preceding embodiments, FIG. 6 is a sectional view illustrating a structure of the enlarged view of region B shown in FIG. 5 taken along section line C-C'. FIG. 7 is a sectional view illustrating a structure of the enlarged view of region B shown in FIG. 5 taken along section line D-D'. FIG. 8 is a sectional view illustrating another structure of the enlarged view of region B shown in FIG. 5 taken along section line D-D'. FIG. 9 is a sectional view illustrating another structure of the enlarged view of region B shown in FIG. 5 taken along section line D-D'. Referring to FIGS. 5 to 9, the wire width of a second main portion **1212*a* of the first wire segment 12121 is greater than the wire width of a second main portion 1212*a* of the second wire segment 12122. Moreover/alternatively, the wire width of a second edge portion 1212*b* of the first wire segment 12121 is greater than the wire width of a second edge portion 1212*b* of the second wire segment 12122**.

Referring to FIGS. 6 and 7, the wire width of the first wire segment 12121 is greater than the wire width of the second wire segment 12122. In an example, the wire width of the second main portion **1212*a* of the first wire segment 12121 is greater than the wire width of the second main portion 1212*a* of the second wire segment 12122. Alternatively, referring to FIGS. 6 and 8, the wire width of the second edge portion 1212*b* of the first wire segment 12121 is greater than the wire width of the second edge portion 1212*b* of the second wire segment 12122. Alternatively, referring to FIGS. 6 and 9, the wire width of the second main portion 1212*a* of the first wire segment 12121 is greater than the wire width of the second main portion 1212*a* of the second wire segment 12122, and the wire width of the second edge portion 1212*b* of the first wire segment 12121 is greater than the wire width of the second edge portion 1212*b* of the second wire segment 12122. The size of the second main portion 1212*a* of the first wire segment 12121, the size of the second main portion 1212*a* of the second wire segment 12122, the size of the second edge portion 1212*b* of the first wire segment 12121, and the size of the second edge portion 1212*b* of the second wire segment 12122 are set reasonably so that the wire width of the first wire segment 12121 is greater than the wire width of the second wire segment 12122, fully guaranteeing that the second wire segments 12122 can be normally disposed in the arrangement region of the second wire segments 12122, guaranteeing the resistance of the first wire segment 12121 with a relatively great wire width is less than the resistance of the second wire segment 12122** with a relatively small wire width, reducing losses of a display signal in the transmission process, and guaranteeing the display effect of the display panel.

Figure 10:
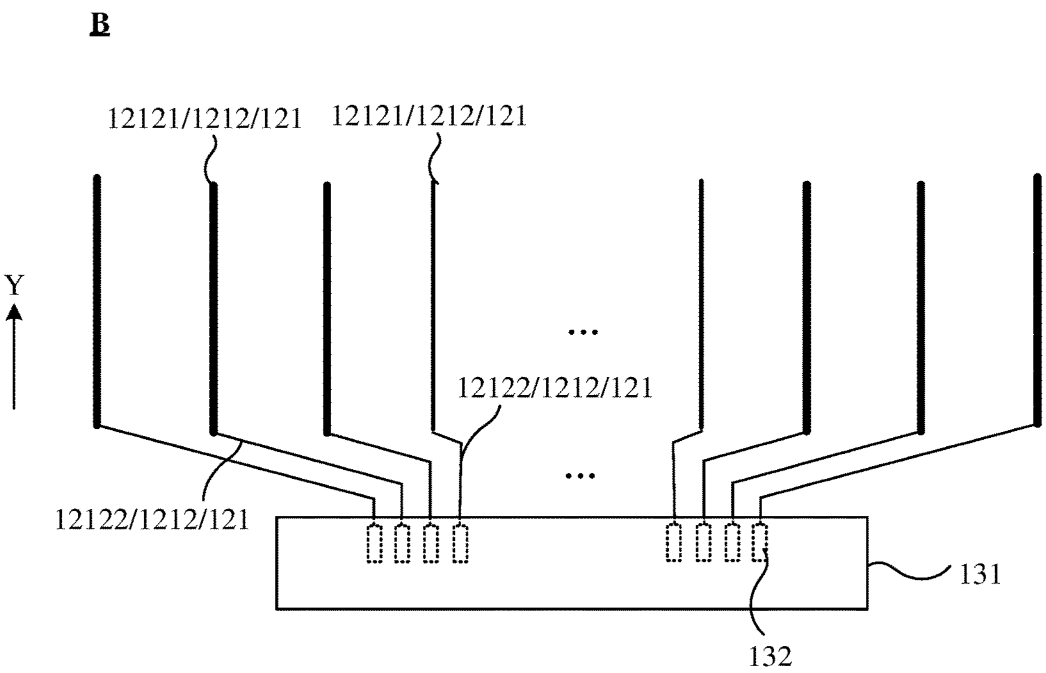
FIG. 10 is another enlarged view of region B of the display panel shown in FIG. 1.

In an exemplary embodiment, FIG. 10 is another enlarged view of region B of the display panel shown in FIG. 1. As shown in FIG. 10, in two second fan-out wires 1212, the wire width of a second fan-out wire 1212 of the two second fan-out wires 1212 closer to an edge of the display panel in the first direction is greater than the wire width of a second fan-out wire 1212 of the two second fan-out wires 1212 closer to the center of the display panel. The first direction is an arrangement direction of the fan-out wires.

In an example, as shown in FIG. 10, the bonding pad 132 is arranged tightly. Therefore, when the second fan-out wires 1212 are electrically connected to the bonding pad 132, the extension length of a second wire segment 12122 of the second fan-out wire 1212 facing the edge of the display panel is greater than the extension length of a second wire segment 12122 of the second fan-out wire 1212 facing the center of the display panel. To guarantee that display signals have the same or similar losses on the second fan-out wires 1212 in different positions, the wire width of the second fan-out wire 1212 facing the edge of the display panel in the first direction may be set to be greater than the wire width of the second fan-out wire 1212 facing the center of the display panel. The relatively great wire width reduces the resistance on a second fan-out wire 1212, compensates for the resistance difference caused by the relatively great length of the second fan-out wire 1212 facing the edge of the display panel, and guarantees the display balance of the display panel.

In an example the wire width of the second fan-out wire facing the edge of the display panel in the first direction is greater than the wire width of the second fan-out wire facing the center of the display panel. In an example, it may be that the wire width of a second main portion of the second fan-out wire facing the edge of the display panel is greater than the wire width of a second main portion of the second fan-out wire facing the center of the display panel; moreover/alternatively, the wire width of a second edge portion of the second fan-out wire facing the edge of the display panel is greater than the wire width of a second edge portion of the second fan-out wire facing the center of the display panel. Such an arrangement guarantees that the relatively great wire width compensates for the resistance difference caused by the relatively great wire length, guarantees the resistance balance of the second fan-out wires 1212 in different positions, guarantees the loss balance of the signals on the second fan-out wires 1212 in different positions, and guarantees a sound display effect balance of the display panel.

Figure 11:
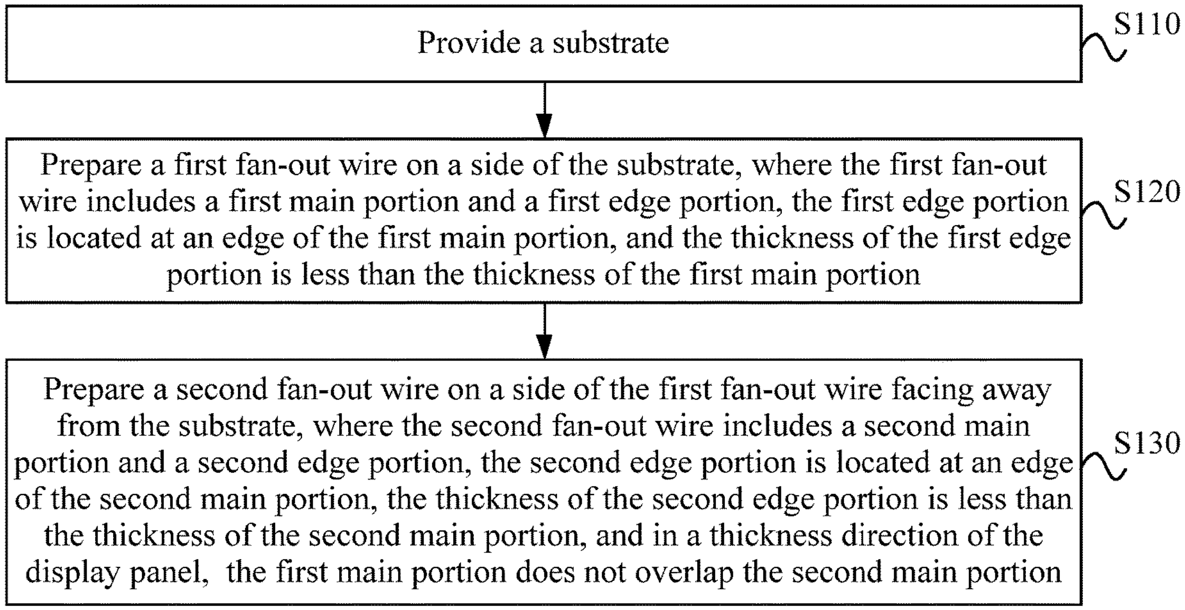
FIG. 11 is a flowchart of a preparation method of a display panel according to an embodiment of the present disclosure.

Based on the same concept, an embodiment of the present disclosure further provides a preparation method for a display panel, which is used for preparing the display panel according to any preceding embodiment. FIG. 11 is a flowchart of a preparation method of a display panel according to an embodiment of the present disclosure. As shown in FIG. 11, the preparation method of a display panel according to the embodiment of the present disclosure includes the steps below.

In S110, a substrate is provided.

Exemplarily, the substrate according to the embodiment of the present disclosure may be a flexible substrate or a rigid substrate. The specific type of the substrate is not limited in the embodiment of the present disclosure.

In S120, a first fan-out wire is prepared on a side of the substrate. The first fan-out wire includes a first main portion and a first edge portion. The first edge portion is located at an edge of the first main portion. The thickness of the first edge portion is less than the thickness of the first main portion.

Exemplarily, referring to FIGS. 2 and 3, the first main portion 1211*a* may be understood as a main structure of the first fan-out wire 1211. Signals are more transmitted in the first main portion 1211*a*. The first edge portion 1211*b* may be understood as a non-main structure of the first fan-out wire 1211, for example, an edge portion caused by a process. In an example, the first main portion 1211*a* and the first edge portion 1211*b* may be divided based on arrangement positions. For example, the first edge portion 1211*b* is located at an edge of the first main portion 1211*a*. Alternatively, the first main portion 1211*a* and the first edge portion 1211*b* may be divided based on layer thicknesses. The thickness of the first edge portion 1211*b* is less than the thickness of the first main portion 1211*a*.

In S130, a second fan-out wire is prepared on a side of the first fan-out wire facing away from the substrate. The second fan-out wire includes a second main portion and a second edge portion. The second edge portion is located at an edge of the second main portion. The thickness of the second edge portion is less than the thickness of the second main portion. In a thickness direction of the display panel, the first main portion does not overlap the second main portion.

Exemplarily, referring to FIGS. 2 and 3, the second fan-out wire 1212 includes the second main portion 1212*a* and the second edge portion 1212*b*. The second main portion 1212*a* may be understood as a main structure of the second fan-out wire 1212. Signals are more transmitted in the second main portion 1212*a*. The second edge portion 1212*b* may be understood as a non-main structure of the second fan-out wire 1212, for example, an edge portion caused by a process. In an example, the second main portion 1212*a* and the second edge portion 1212*b* may be divided based on arrangement positions. For example, the second edge portion 1212*b* is located at an edge of the second main portion 1212*a*. Alternatively, the second main portion 1212*a* and the second edge portion 1212*b* may be divided based on layer thicknesses. The thickness of the second edge portion 1212*b* is less than the thickness of the second main portion 1212*a*.

In an example, at least one first main portion 1211*a* does not overlap at least one second main portion 1212*a* in the thickness direction (for example, direction Z shown in FIG. 2) of the display panel, preventing a parasitic capacitance from being generated between the first main portion 1211*a* and the second main portion 1212*a*, guaranteeing that display signals transmitted in the first fan-out wire and the second fan-out wire are subject to little interference, and guaranteeing the display effect. Moreover, a layer above the fan-out wires may not have poor coverage due to the overlapping and protrusion of main portions, guaranteeing the flatness of the layer above the fan-out wires and further guaranteeing the structural stability of the display panel.

Above all, for the preparation method for a display panel according to the embodiment of the present disclosure, the fan-out wires are configured to include the first fan-out wires and the second fan-out wires, with the first fan-out wires in a different layer from the second fan-out wires. A small distance exists between a first fan-out wire and a second fan-out wire that are in different layers, thereby reducing the space occupied by the fan-out wires in a bezel region, reducing the lower bezel of the display panel, and helping implement the display panel designed with a narrow bezel. Further, the first main portion of the first fan-out wire does not overlap the second main portion of the second fan-out wire, preventing a parasitic capacitance from being generated between the first main portion and the second main portion, guaranteeing that display signals transmitted in the first fan-out wire and the second fan-out wire are subject to little interference, and guaranteeing the display effect. Moreover, a layer above the fan-out wires may not have poor coverage due to the overlapping and protrusion of main portions, guaranteeing the structural stability of the display panel.

Figure 12:
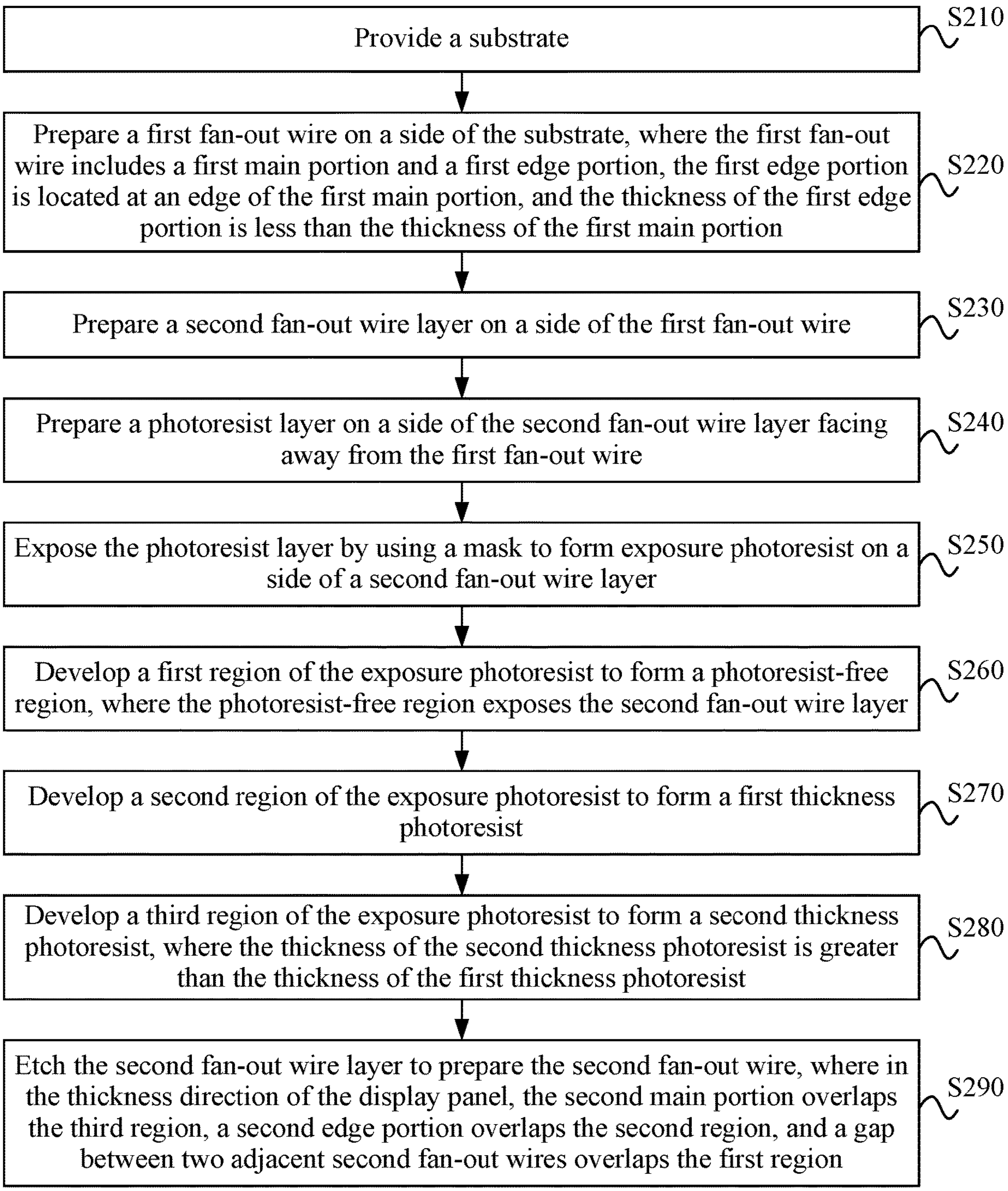
FIG. 12 is a flowchart of another preparation method of a display panel according to an embodiment of the present disclosure.

On the basis of the preceding embodiments, FIG. 12 is a flowchart of another preparation method of a display panel according to an embodiment of the present disclosure. The preparation method shown in FIG. 12 is a detailed description of how to prepare a second fan-out wire on the basis of the preceding embodiments. As shown in FIG. 12, the preparation method according to the embodiment of the present disclosure includes the steps below.

In S210, a substrate is provided.

In S220, a first fan-out wire is prepared on a side of the substrate. The first fan-out wire includes a first main portion and a first edge portion. The first edge portion is located at an edge of the first main portion. The thickness of the first edge portion is less than the thickness of the first main portion.

In S230, a second fan-out wire layer is prepared on a side of the first fan-out wire.

Figure 13:
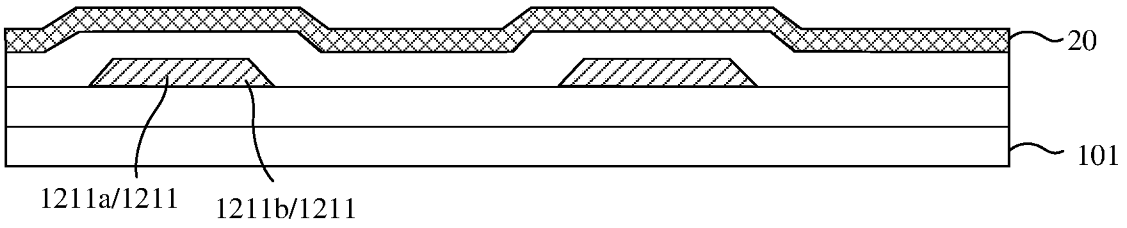
FIG. 13 is a structural diagram illustrating the preparation of a second fan-out wire layer on a side of a first fan-out wire according to an embodiment of the present disclosure.

In an exemplary embodiment, FIG. 13 is a structural diagram illustrating the preparation of a second fan-out wire layer on a side of a first fan-out wire according to an embodiment of the present disclosure. As shown in FIG. 13, the second fan-out wire layer 20 disposed as an entire layer is prepared first.

In S240, a photoresist layer is prepared on a side of the second fan-out wire layer facing away from the first fan-out wire.

Figure 14:
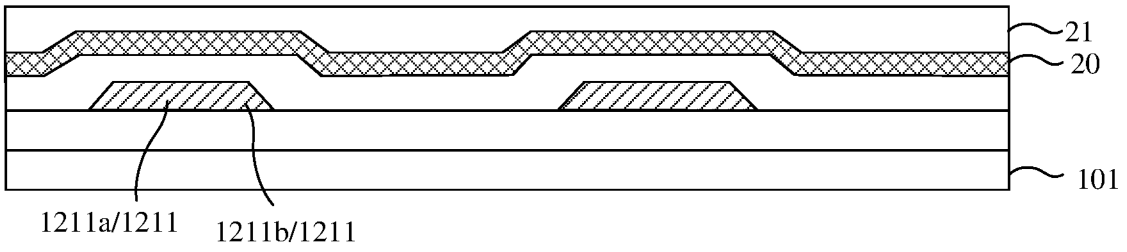
FIG. 14 is a structural diagram illustrating the preparation of a photoresist layer on a side of the second fan-out wire layer facing away from the first fan-out wire according to an embodiment of the present disclosure.

In an exemplary embodiment, FIG. 14 is a structural diagram illustrating the preparation of a photoresist layer on a side of the second fan-out wire layer facing away from the first fan-out wire according to an embodiment of the present disclosure. As shown in FIG. 14, the photoresist 21 disposed as an entire layer is prepared on a side of the second fan-out wire layer 20 facing away from the first fan-out wire 1211.

In S250, the photoresist layer is exposed by using a mask to form exposure photoresist on a side of a second fan-out wire layer.

Figure 15:
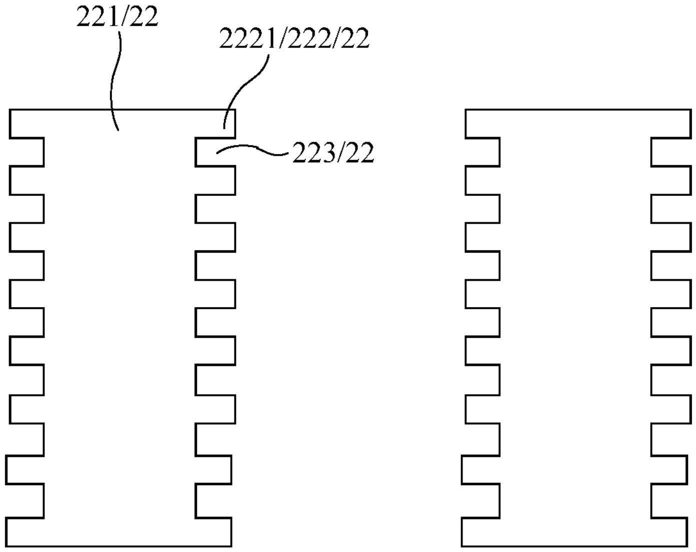
FIG. 15 is a structural diagram of a mask according to an embodiment of the present disclosure.
Figure 16:
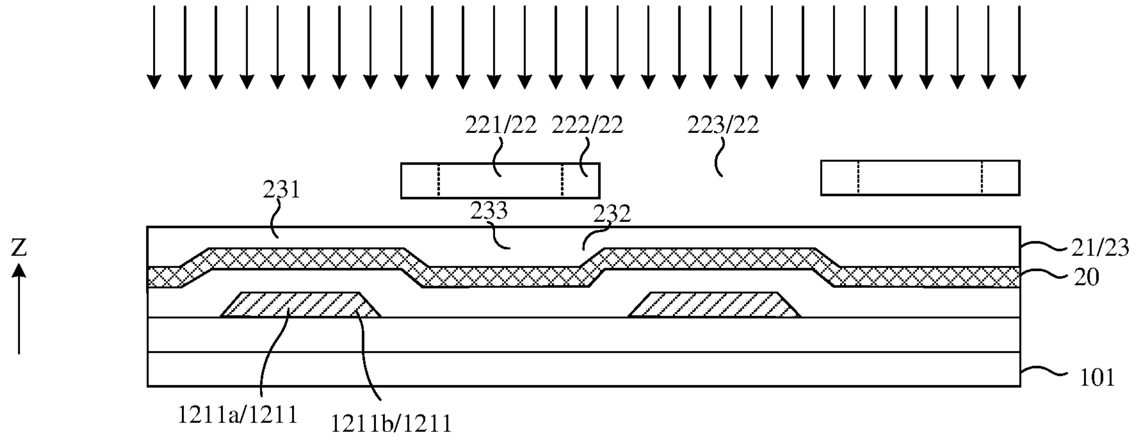
FIG. 16 is a structural diagram illustrating the forming of exposure photoresist through the mask according to an embodiment of the present disclosure.

In an exemplary embodiment, FIG. 15 is a structural diagram of a mask according to an embodiment of the present disclosure. FIG. 16 is a structural diagram illustrating the forming of exposure photoresist through the mask according to an embodiment of the present disclosure. As shown in FIGS. 15 and 16, the mask 22 includes a mask main portion 221 and a mask edge portion 222 that are connected to each other. In an arrangement direction of the mask protrusions, the mask edge portion 222 includes multiple mask protrusions 2221. A hollow region 223 is disposed between two adjacent mask protrusions 2221. The exposure photoresist 23 includes a first region 231, a second region 232, and a third region 233. In the thickness direction (for example, direction Z shown in the figure) of the display panel, the second region 232 overlaps the mask edge portion 222. The third region 233 overlaps the mask main portion 221. The first region 231 overlaps a region between two adjacent mask edge portions 222 and does not overlap the mask.

Exemplarily, as shown in FIGS. 15 and 16, the mask 22 includes the mask main portion 221 and the mask edge portion 222 that are connected to each other. The mask main portion 221 may completely block or nearly completely block exposure light. That is, the exposure light cannot be irradiated into the photoresist 21 through the mask main portion 221. In this case, the photoresist in the third region 233 below the mask main portion 221 is not exposed or is slightly exposed. The mask edge portion 222 includes the mask protrusions 2221. A hollow region 223 is disposed between two adjacent mask protrusions 2221. That is, part of the exposure light may pass through the hollow region and be irradiated into the photoresist 21 through the hollow region. In this case, the photoresist in the second region 232 below the mask edge portion 222 is partially exposed, with the exposure amount of the photoresist in the second region 232 being greater than the exposure amount of the photoresist in the third region 233. No mask pattern exists between two adjacent mask edge portions 222. That is, a region between two adjacent mask edge portions 222 does not block the exposure light at all. In other words, the exposure light completely passes through the region between two adjacent mask edge portions 222 and is irradiated into the photoresist 21. In this case, the photoresist in the first region 231 between two adjacent mask edge portions 222 is fully and completely exposed, with the exposure amount of the photoresist in the first region 231 being greater than the exposure amount of the photoresist in the second region 232. With this arrangement, three exposure regions with different exposure amounts are formed in the exposure photoresist, that is, the first region 231, the second region 232, and the third region 233. The photoresist in the first region 231 is fully exposed due to no mask and has the greatest exposure amount. The photoresist in the second region 232 is partially exposed due to a partial mask and a partial hollow and has a moderate exposure amount. The photoresist in the third region 233 is not exposed or is slightly exposed due to a complete mask and has the least exposure amount.

In S260, the first region of the exposure photoresist is developed to form a photoresist-free region. The photoresist-free region exposes the second fan-out wire layer.

Figure 17:
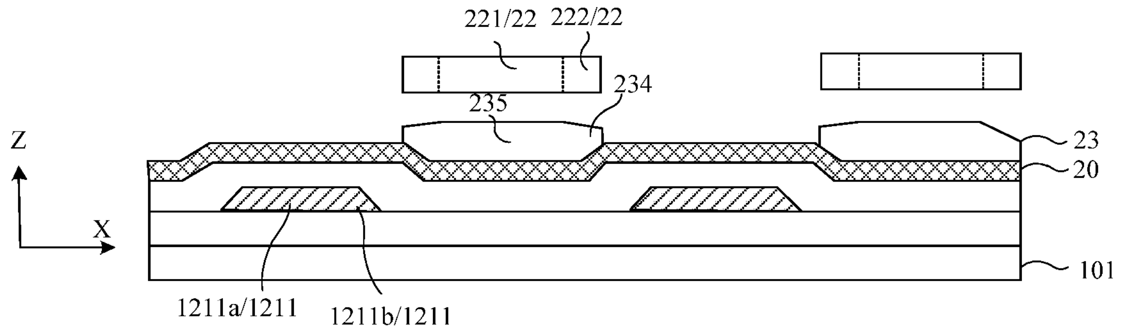
FIG. 17 is a structural diagram illustrating the development of the exposure photoresist according to an embodiment of the present disclosure.

FIG. 17 is a structural diagram illustrating the development of the exposure photoresist according to an embodiment of the present disclosure. As shown in FIG. 17, the first region 231 of the exposure photoresist 23 is developed through a developing solution. Since the first region 231 is completely exposed, the photoresist-free region is formed after the first region 231 of the exposure photoresist 23 is developed. The second fan-out wire layer 20 of the first region 231 is exposed with no coverage of any photoresist.

In S270, the second region of the exposure photoresist is developed to form a first thickness photoresist.

With continued reference to FIG. 17, the second region 232 of the exposure photoresist 23 is developed through a developing solution. Since the second region 232 is partially exposed, the photoresist with a certain thickness is not exposed and is retained after the second region 232 of the exposure photoresist 23 is developed. Therefore, the photoresist with a certain thickness, for example, a first thickness photoresist 234, is retained after the second region 232 of the exposure photoresist is developed. The thickness of the first thickness photoresist 234 is less than the thickness of the photoresist before exposure and development.

Moreover, in a direction of the mask main portion pointing to the mask edge portion, the width of the mask edge portion is positively related to the width of the first thickness photoresist.

Exemplarily, referring to FIGS. 15 and 17, in the direction (for example, direction X shown in the figure) of the mask main portion 221 pointing to the mask edge portion 222, the greater the width of the mask edge portion 222, the larger the blocking region of the mask 22 in direction X. Therefore, the larger the blocked region of the photoresist, the greater the width of the first thickness photoresist formed subsequently. The width of the first thickness photoresist corresponds to the size of a second edge portion in the second fan-out wire. Therefore, the width of the first thickness photoresist can be adjusted by adjusting the width of the mask edge portion, thereby adjusting the size of the second edge portion in the second fan-out wire.

In S280, the third region of the exposure photoresist is developed to form a second thickness photoresist. The thickness of the second thickness photoresist is greater than the thickness of the first thickness photoresist.

With continued reference to FIG. 17, the third region 233 of the exposure photoresist 23 is developed through a developing solution. Since the third region 233 is not exposed or is slightly exposed, the photoresist with a considerable thickness is not exposed and is retained after the third region 233 of the exposure photoresist 23 is developed. Therefore, the photoresist with a considerable thickness, for example, the second thickness photoresist 235, is retained after the third region 233 of the exposure photoresist is developed. The thickness of the third thickness photoresist 235 is equal to or approximately equal to the thickness of the photoresist before exposure and development.

In S290, the second fan-out wire layer is etched to prepare the second fan-out wire. In the thickness direction of the display panel, the second main portion overlaps the third region, the second edge portion overlaps the second region, and a gap between two adjacent second fan-out wires overlaps the first region.

In an exemplary embodiment, referring to FIGS. 17 and 2, the second fan-out wire layer is etched through the preceding exposure mask to prepare the second fan-out wire. The second main portion 1212*a* overlaps the third region 233. The second fan-out wire layer in the third region 233 is retained to form the second main portion 1212*a*. The second edge portion 1212*b* overlaps the second region 232. The second fan-out wire layer in the second region 232 is etched to form the second edge portion 1212*b*. The second fan-out wire layer 20 exposed by the first region 231 is etched completely to form the gap between the two adjacent second fan-out wires 1212. That is, the gap between the two adjacent second fan-out wires 1212 overlaps the first region 231. Multiple second fan-out wires 1212 that are independently disposed are finally obtained. Each second fan-out wire 1212 includes a second main portion 1212*a* and a second edge portion 1212*b*.

Above all, the photoresist disposed as an entire layer is exposed through the mask including the mask main portion and the mask edge portion so as to form the exposure photoresist, thereby obtaining the first region, the second region and the third region with different exposure degrees. That is, the photoresist with different exposure degrees is obtained through the OPC process. Then different structures of the second fan-out wire are obtained separately through the photoresist with different exposure degrees. Such an arrangement can avoid the problem of a poor subsequent process in the existing second fan-out wire preparation process caused by a recess in the layer above the fan-out wires due to an excessively great distance between the first fan-out wire and the second fan-out wire caused by over-etching. Alternatively, such an arrangement avoids the problem of a poor subsequent process in the existing second fan-out wire preparation process caused by a protrusion in the layer above the fan-out wires due to an excessively large overlapping area between the first fan-out wire and the second fan-out wire caused by under-etching. The OPC process can guarantee that the distance between the second fan-out wire and the first fan-out wire is neither excessively great nor excessively small, guarantee that the first fan-out wire and the second fan-out wire do not excessively overlap each other and are not excessively far from each other, guarantee a normal wiring density of the first fan-out wire and the second fan-out wire, guarantee that display signals transmitted in the first fan-out wire and the second fan-out wire are subject to little interference, and guarantee the display effect. Moreover, the first fan-out wire and the second fan-out wire are not excessively far from each other and do not excessively overlap each other, preventing the layer above the fan-out wires from not being flat and guaranteeing the structural stability of the display panel.

Figure 18:
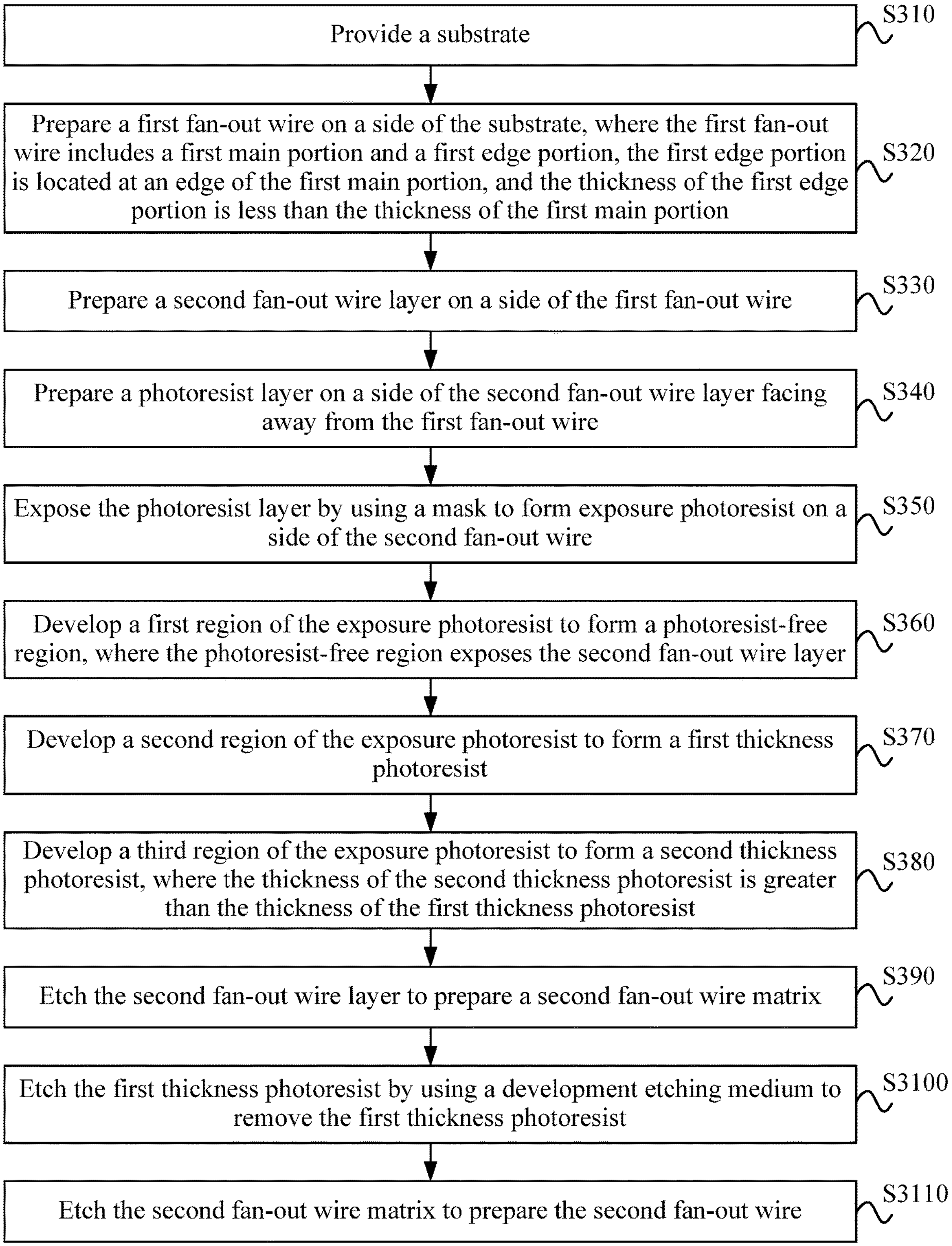
FIG. 18 is a flowchart of another preparation method of a display panel according to an embodiment of the present disclosure.

On the basis of the preceding embodiments, FIG. 18 is a flowchart of another preparation method of a display panel according to an embodiment of the present disclosure. The preparation method shown in FIG. 18 is a detailed description of how to prepare a second fan-out wire through a secondary etching process on the basis of the preceding embodiments.

As shown in FIG. 18, the preparation method according to the embodiment of the present disclosure includes the steps below.

In S310, a substrate is provided.

In S320, a first fan-out wire is prepared on a side of the substrate. The first fan-out wire includes a first main portion and a first edge portion. The first edge portion is located at an edge of the first main portion. The thickness of the first edge portion is less than the thickness of the first main portion.

In S330, a second fan-out wire layer is prepared on a side of the first fan-out wire.

In S340, a photoresist layer is prepared on a side of the second fan-out wire layer facing away from the first fan-out wire.

In S350, the photoresist layer is exposed by using a mask to form exposure photoresist on a side of the second fan-out wire.

In S360, a first region of the exposure photoresist is developed to form a photoresist-free region. The photoresist-free region exposes the second fan-out wire layer.

In S370, a second region of the exposure photoresist is developed to form a first thickness photoresist.

In S380, a third region of the exposure photoresist is developed to form a second thickness photoresist. The thickness of the second thickness photoresist is greater than the thickness of the first thickness photoresist.

In S390, the second fan-out wire layer is etched to prepare a second fan-out wire matrix.

Figure 19:
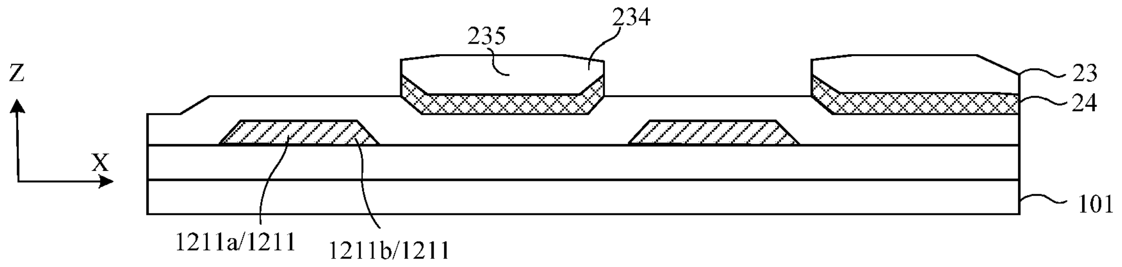
FIG. 19 is a structural diagram illustrating that the second fan-out wire layer is etched to prepare a second fan-out wire matrix according to an embodiment of the present disclosure.

In an exemplary embodiment, FIG. 19 is a structural diagram illustrating that the second fan-out wire layer is etched to prepare a second fan-out wire matrix according to an embodiment of the present disclosure. Referring to FIGS. 17 and 19, the photoresist in the first region 231 is completely developed and removed to form the photoresist-free region. Therefore, the second fan-out wire layer 20 corresponding to the first region is completely exposed. In this case, a first etching medium may be used for etching the second fan-out wire layer exposed by the photoresist-free region. The first etching medium may be understood as an etching medium, such as an etching gas, that reacts with the second fan-out wire layer. That is, the second fan-out wire layer exposed by the photoresist-free region may be etched and removed through the first etching medium. The first region of the second fan-out wire is etched and removed through the first etching medium to obtain the second fan-out wire matrix 24.

In S3100, the first thickness photoresist is etched by using a development etching medium to remove the first thickness photoresist.

Figure 20:
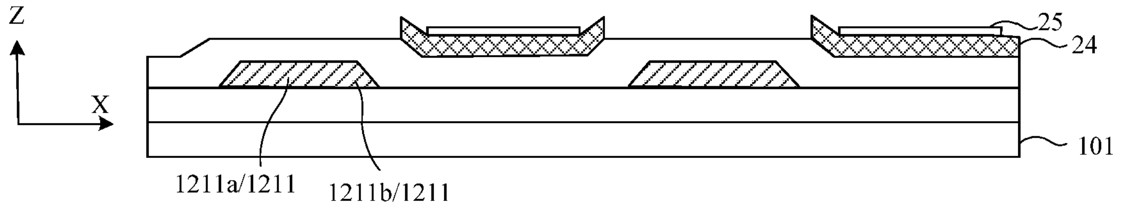
FIG. 20 is a structural diagram illustrating the removal of first thickness photoresist according to an embodiment of the present disclosure.

In an exemplary embodiment, FIG. 20 is a structural diagram illustrating the removal of first thickness photoresist according to an embodiment of the present disclosure. Referring to FIGS. 19 and 20, after the second fan-out wire matrix 24 is obtained, the first thickness photoresist 234 continues to be etched through the development etching medium, for example, a developing solution, until the first thickness photoresist is completely etched and removed. In this case, at least part of the second fan-out wire matrix originally covered by the first thickness photoresist is exposed.

It is to be noted that as shown in FIG. 20, the first thickness photoresist 234 and the second thickness photoresist 235 are of the same material type. Therefore, when the development etching medium is used for etching the first thickness photoresist to remove the first thickness photoresist, the development etching medium also etches the second thickness photoresist. Since the thickness of the second thickness photoresist is greater than the thickness of the first thickness photoresist, some photoresist may be retained in the coverage region of the original second thickness photoresist after the first thickness photoresist is completely etched and removed, as the thinned photoresist 25 shown in the figure. This part of the photoresist continues to cover the second fan-out wire matrix 24. That is, when the development etching medium is used for etching the first thickness photoresist to remove the first thickness photoresist, the second thickness photoresist is thinned. However, some photoresist is finally retained in the coverage region of the original second thickness photoresist, as the thinned photoresist 25 shown in the figure. This part of the photoresist continues to cover the second fan-out wire matrix 24.

In S3110, the second fan-out wire matrix is etched to prepare the second fan-out wire.

Figure 21:
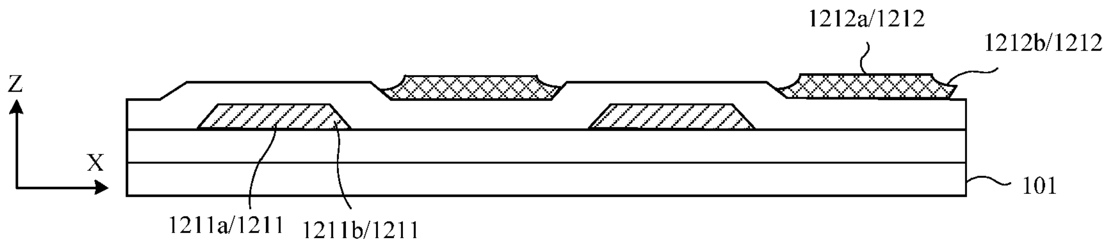
FIG. 21 is a structural diagram illustrating that the second fan-out wire matrix is etched to prepare a second fan-out wire according to an embodiment of the present disclosure.

In an exemplary embodiment, FIG. 21 is a structural diagram illustrating that the second fan-out wire matrix is etched to prepare a second fan-out wire according to an embodiment of the present disclosure. Referring to FIGS. 20 and 21, a second etching medium is used for etching the second fan-out wire matrix 24 exposed by the first thickness photoresist. The second etching medium reacts with the second fan-out wire matrix 24. The second region of the second fan-out wire matrix 24 is etched and removed through the second etching medium to obtain the second fan-out wire 1212.

The second etching medium may be understood as an etching medium, such as an etching gas, that reacts with the second fan-out wire matrix material. An edge portion of the second fan-out wire matrix 24 is removed by the second etching medium reacting with the second fan-out wire matrix 24 so as to obtain a second edge portion 1212*b* of the second fan-out wire 1212. The remaining part of the second fan-out wire matrix 24 is covered by the thinned photoresist 25. This part of the second fan-out wire matrix 24 does not react with the second etching medium and is retained to form a second main portion 1212*a* of the second fan-out wire 1212.

Above all, for the preparation method according to the embodiment of the present disclosure, the photoresist-free region is obtained through the first etching of the photoresist. The second fan-out wire layer is etched for the first time through the photoresist-free region to obtain the second fan-out wire matrix. The first thickness photoresist is removed through the second etching of the photoresist. The second fan-out wire matrix exposed by the first thickness photoresist by using a second etching medium to obtain the second fan-out wire. That is, the second fan-out wire including the second main portion and the second edge portion is prepared and obtained through the etching of the photoresist twice and the etching of the second fan-out wire layer twice. The size of the mask main portion in the mask and the size of the mask edge portion in the mask are controlled reasonably so as to accurately control the size of the photoresist-free region in the photoresist and the size of the first thickness photoresist in the photoresist, implementing the accurate control on the size of the second fan-out wire, guaranteeing that the distance between the second fan-out wire and the first fan-out wire is neither excessively great nor excessively small, guaranteeing that the first fan-out wire and the second fan-out wire do not excessively overlap each other and are not excessively far from each other, guaranteeing a normal wiring density of the first fan-out wire and the second fan-out wire, guaranteeing that display signals transmitted in the first fan-out wire and the second fan-out wire are subject to little interference, and guaranteeing the display effect. Moreover, the first fan-out wire and the second fan-out wire are not excessively far from each other and do not excessively overlap each other, preventing the layer above the fan-out wires from not being flat and guaranteeing the structural stability of the display panel.

Figure 22:
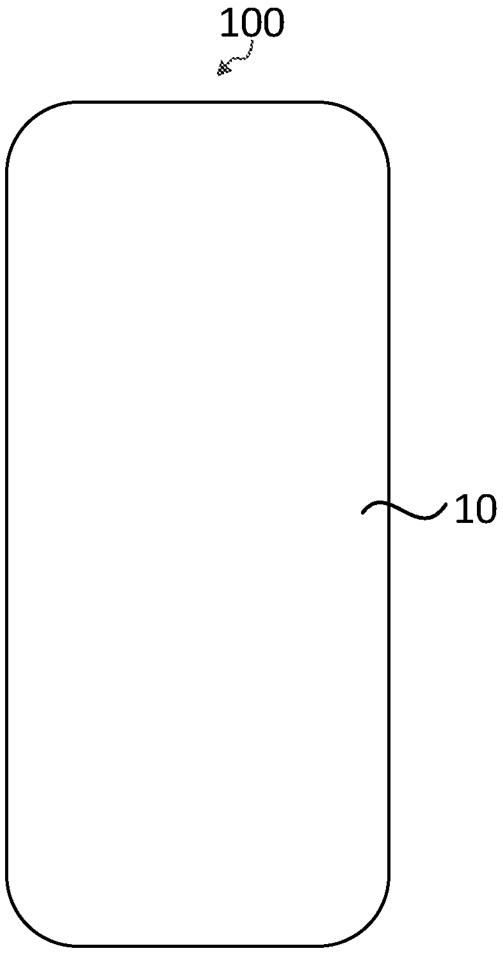
FIG. 22 is a structural diagram of a display apparatus according to an embodiment of the present disclosure.

Based on the same concept, an embodiment of the present disclosure further provides a display apparatus. FIG. 22 is a structural diagram of a display apparatus according to an embodiment of the present disclosure. As shown in FIG. 22, the display apparatus 100 includes the display panel 10 according to any preceding embodiment. Therefore, the display apparatus 100 according to the embodiment of the present disclosure has the same beneficial effects as the preceding embodiments. Details are not described herein. Exemplarily, the display apparatus 100 may be an electronic device such as a mobile phone, a computer, a smart wearable device (for example, a smart watch), and an onboard display device, which is not limited in the embodiment of the present disclosure.

The preceding embodiments do not limit the scope of the present disclosure. It is to be understood by those skilled in the art that various modifications, combinations, sub-combinations, and substitutions may be performed according to design requirements and other factors. Any modification, equivalent substitution, improvement, or the like made within the spirit and principle of the present disclosure is within the scope of the present disclosure.

What is claimed is:

1. A display panel, comprising a display region and a fan-out wire region, wherein the display region comprises a plurality of data lines, the fan-out wire region comprises a plurality of fan-out wires, and a fan-out wire of the plurality of fan-out wires is electrically connected to a respective data line of the plurality of data lines;

the plurality of fan-out wires comprise a plurality of first fan-out wires and a plurality of second fan-out wires, the display panel further comprises a substrate, and a second fan-out wire of the plurality of second fan-out wires is located on a side of a first fan-out wire of the plurality of first fan-out wires facing away from the substrate;

the first fan-out wire comprises a first main portion and a first edge portion, the first edge portion is located at an edge of the first main portion, a thickness of the first edge portion is less than a thickness of the first main portion, the second fan-out wire comprises a second main portion and a second edge portion, the second edge portion is located at an edge of the second main portion, and a thickness of the second edge portion is less than a thickness of the second main portion; and in a thickness direction of the display panel, at least one second main portion of second main portions of the plurality of second fan-out wires does not overlap with all first body portions of first main portions of the plurality of first fan-out wires that are adjacent to the at least one second main body portion along an arrangement direction of the plurality of fan-out wires.

2. The display panel according to claim 1, wherein the first edge portion partially overlaps the second edge portion in the thickness direction of the display panel; or the first edge portion does not overlap the second edge portion in the thickness direction of the display panel; in a first direction, a minimum distance L between the first edge portion and the second edge portion satisfies that L≤0.3 μm; and the first direction is an arrangement direction of the plurality of fan-out wires.

3. The display panel according to claim 1, wherein the thickness of the second edge portion increases gradually in a direction of the second edge portion pointing to the second main portion.

4. The display panel according to claim 1, wherein the second main portion comprises a first surface on a side of the second main portion facing the substrate, the second edge portion comprises a second surface on a side of the second edge portion facing the substrate, a plane where the first surface is located is parallel to a plane where the substrate is located, and a plane where the second surface is located intersects the plane where the substrate is located.

5. The display panel according to claim 1, wherein the second main portion comprises a third surface on a side of the second main portion facing away from the substrate, and a plane where the third surface is located is parallel to a plane where the substrate is located; and the second edge portion comprises a second surface on a side of the second edge portion facing the substrate and a first side surface connecting the second surface and the third surface, and the first side surface comprises a curved surface.

6. The display panel according to claim 5, wherein the first side surface has two positions, and an included angle between a tangent plane of a position of the two positions closer to the second main portion and the plane where the substrate is located is greater than an included angle between a tangent plane of a position of the two positions farther away from the second main portion and the plane where the substrate is located.

7. The display panel according to claim 1, wherein the first edge portion comprises a second side surface, the second edge portion comprises a second surface on a side of the second edge portion facing the substrate, and a plane where the second side surface is located is parallel to a plane where the second surface is located.

8. The display panel according to claim 1, wherein in a first direction, a width of the second fan-out wire is greater than a width of the first fan-out wire, and the first direction is an arrangement direction of the plurality of fan-out wires.

9. The display panel according to claim 1, further comprising a bonding region, wherein the bonding region is located on a side of the fan-out wire region facing away from the display region, and the bonding region comprises a bonding pad;

the second fan-out wire comprises a first wire segment and a second wire segment that are connected to each other, the first wire segment is electrically connected to a data line of the plurality of data lines, the second wire segment is electrically connected to the bonding pad, an included angle between the first wire segment and a preset direction is less than an included angle between the second wire segment and the preset direction, and the preset direction is parallel to a direction of the display region pointing to the bonding region; and a wire width of the first wire segment is greater than a wire width of the second wire segment.

10. The display panel according to claim 9, wherein the first wire segment satisfies at least one of the following:

a wire width of a second main portion of the first wire segment is greater than a wire width of a second main portion of the second wire segment; or a wire width of a second edge portion of the first wire segment is greater than a wire width of a second edge portion of the second wire segment.

11. The display panel according to claim 1, wherein in two second fan-out wires of the plurality of second fan-out wires, a wire width of a second fan-out wire of the two second fan-out wires closer to an edge of the display panel in a first direction is greater than a wire width of a second fan-out wire of the two second fan-out wires closer to a center of the display panel; and the first direction is an arrangement direction of the plurality of fan-out wires.

12. A preparation method of a display panel configured to prepare a display panel, wherein the display panel comprises: a display region and a fan-out wire region, wherein the display region comprises a plurality of data lines, the fan-out wire region comprises a plurality of fan-out wires, and a fan-out wire of the plurality of fan-out wires is electrically connected to a respective data line of the plurality of data lines; the plurality of fan-out wires comprise a plurality of first fan-out wires and a plurality of second fan-out wires, the display panel further comprises a substrate, and a second fan-out wire of the plurality of second fan-out wires is located on a side of a first fan-out wire of the plurality of first fan-out wires facing away from the substrate; the first fan-out wire comprises a first main portion and a first edge portion, the first edge portion is located at an edge of the first main portion, a thickness of the first edge portion is less than a thickness of the first main portion, the second fan-out wire comprises a second main portion and a second edge portion, the second edge portion is located at an edge of the second main portion, and a thickness of the second edge portion is less than a thickness of the second main portion; and in a thickness direction of the display panel, at least one second main portion of second main portions of the plurality of second fan-out wires does not overlap with all first body portions of first main portions of the plurality of first fan-out wires that are adjacent to the at least one second main body portion along an arrangement direction of the plurality of fan-out wires wherein the preparation method comprises:

providing the substrate;

preparing the first fan-out wire on a side of the substrate; and preparing the second fan-out wire on a side of the first fan-out wire facing away from the substrate.

13. The preparation method according to claim 12, wherein preparing the second fan-out wire on the side of the first fan-out wire facing away from the substrate comprises:

preparing a second fan-out wire layer on a side of the first fan-out wire;

preparing a photoresist layer on a side of the second fan-out wire layer facing away from the first fan-out wire;

exposing the photoresist layer by using a mask to form an exposure photoresist on a side of the second fan-out wire layer, wherein the mask comprises a mask main portion and a mask edge portion that are connected to each other; the mask edge portion comprises a plurality of mask protrusions; a hollow region is disposed between two adjacent mask protrusions of the plurality of mask protrusions in an arrangement direction of the plurality of mask protrusions;

the exposure photoresist comprises a first region, a second region, and a third region; and in the thickness direction of the display panel, the second region overlaps the mask edge portion, the third region overlaps the mask main portion, and the first region overlaps a region between two adjacent mask edge portions and does not overlap the mask; and etching the second fan-out wire layer to prepare the second fan-out wire, wherein in the thickness direction of the display panel, the second main portion overlaps the third region, the second edge portion overlaps the second region, and a gap between two adjacent second fan-out wires overlaps the first region.

14. The preparation method according to claim 13, after exposing the photoresist layer by using a mask to form the exposure photoresist on the side of the second fan-out wire layer, further comprising:

developing the first region of the exposure photoresist to form a photoresist-free region, wherein the photoresist-free region exposes the second fan-out wire layer;

developing the second region of the exposure photoresist to form a first thickness photoresist; and developing the third region of the exposure photoresist to form a second thickness photoresist, wherein a thickness of the second thickness photoresist is greater than a thickness of the first thickness photoresist.

15. The preparation method according to claim 14, wherein etching the second fan-out wire layer to prepare the second fan-out wire comprises:

etching the second fan-out wire layer to prepare a second fan-out wire matrix; and etching the second fan-out wire matrix to prepare the second fan-out wire.

16. The preparation method according to claim 15, wherein etching the second fan-out wire layer to prepare the second fan-out wire matrix comprises:

etching the second fan-out wire layer exposed by the photoresist-free region by using a first etching medium, wherein the first etching medium reacts with the second fan-out wire layer, and a first region of the second fan-out wire layer is etched and removed through the first etching medium to obtain the second fan-out wire matrix.

17. The preparation method according to claim 16, after etching the second fan-out wire layer to prepare the second fan-out wire matrix, further comprising:

etching the first thickness photoresist by using a development etching medium to remove the first thickness photoresist, wherein the first thickness photoresist exposes at least part of the second fan-out wire matrix.

18. The preparation method according to claim 17, wherein etching the second fan-out wire matrix to prepare the second fan-out wire comprises:

etching the second fan-out wire matrix exposed by the first thickness photoresist by using a second etching medium, wherein the second etching medium reacts with the second fan-out wire matrix, and a second region of the second fan-out wire matrix is etched and removed through the second etching medium to obtain the second fan-out wire.

19. The preparation method according to claim 14, wherein in a direction of the mask main portion pointing to the mask edge portion, a width of the mask edge portion is positively related to a width of the first thickness photoresist.

20. A display apparatus, comprising a display panel, where the display panel comprises: a display region and a fan-out wire region, wherein the display region comprises a plurality of data lines, the fan-out wire region comprises a plurality of fan-out wires, and a fan-out wire of the plurality of fan-out wires is electrically connected to a respective data line of the plurality of data lines;

the plurality of fan-out wires comprise a plurality of first fan-out wires and a plurality of second fan-out wires, the display panel further comprises a substrate, and a second fan-out wire of the plurality of second fan-out wires is located on a side of a first fan-out wire of the plurality of first fan-out wires facing away from the substrate;

the first fan-out wire comprises a first main portion and a first edge portion, the first edge portion is located at an edge of the first main portion, a thickness of the first edge portion is less than a thickness of the first main portion, the second fan-out wire comprises a second main portion and a second edge portion, the second edge portion is located at an edge of the second main portion, and a thickness of the second edge portion is less than a thickness of the second main portion; and in a thickness direction of the display panel, at least one second main portion of second main portions of the plurality of second fan-out wires does not overlap with all first body portions of first main portions of the plurality of first fan-out wires that are adjacent to the at least one second main body portion along an arrangement direction of the plurality of fan-out wires.

* * * * *